United States Patent [19]

Miller et al.

[11] Patent Number: 5,714,804
[45] Date of Patent: Feb. 3, 1998

[54] SEMICONDUCTOR CONTACT STRUCTURE IN INTEGRATED SEMICONDUCTOR DEVICES

[75] Inventors: Robert O. Miller; Gregory C. Smith, both of Carrollton, Tex.

[73] Assignee: SGS-Thomson Microelectronics, Inc., Carrollton, Tex.

[21] Appl. No.: 749,083

[22] Filed: Nov. 14, 1996

Related U.S. Application Data

[63] Continuation of Ser. No. 366,215, Dec. 29, 1994, abandoned.

[51] Int. Cl.⁶ .................. H01L 23/48; H01L 23/52; H01L 29/40
[52] U.S. Cl. .................. 257/763; 257/734; 257/736; 257/750; 257/764; 257/774
[58] Field of Search .................. 257/763, 764, 257/774, 734, 736, 750

[56] References Cited

U.S. PATENT DOCUMENTS

| | | | |
|---|---|---|---|
| 4,592,802 | 6/1986 | Deleonibus et al. | 156/644 |
| 4,824,521 | 4/1989 | Kulkarni et al. | 156/643 |
| 5,070,391 | 12/1991 | Liou et al. | 357/71 |
| 5,374,849 | 12/1994 | Tada | 257/751 |

FOREIGN PATENT DOCUMENTS

| | | |
|---|---|---|
| 0 448 276 A3 | 9/1991 | European Pat. Off. . |
| 0 506 426 A1 | 9/1992 | European Pat. Off. . |
| 0 561 132 A1 | 9/1993 | European Pat. Off. . |
| 43 06 322 A1 | 3/1993 | Germany . |
| 438875 | 2/1992 | Japan .................. 257/764 |
| 5-195525 | 8/1993 | Japan . |
| 5-243390 | 9/1993 | Japan . |
| 5-283362 | 10/1993 | Japan . |
| 5-347274 | 12/1993 | Japan . |

OTHER PUBLICATIONS

Wolf, Stanley, *Silicon Processing for The VLSI Era*, Lattice Press, Sunset Beach, California, 1990, vol. 2, "Process Integration," pp. 245–252.

Kaanta, Carter et al., *Submicron Wiring Technology with Tungsten and Planarization*, IBM General Technology Division, Essex Junction, Vermont 05452, pp. IEDM 87-209–IEDM 87-212, 1987.

Kaanta, Carter et al., *Submicron Wiring Technology with Tungsten and Planarization*, 1988 Proceedings Fifth International IEEE VLSI Multilevel Interconnection Conference, Jun. 13–14, 1988, Santa Clara, CA., pp. 21–28.

Lee, Pei–Ing, John Cronin and Carter Kaanta, "Chemical Vapor Deposition of Tungsten (CVD W) as Submicron Interconnection and Via Stud," *J. Electrochem. Soc.* 136:(7), pp. 2108–2112, 1989.

Estabil, J.J., H.S. Rathore and E.N. Levine, *Electromigration Improvements with Titanium Underlay and Overlay in AL(Cu) Metallurgy*, Jun. 11–12, 1991 VMIC Conference, General Technology Division, IBM Corporation, Hopewell Junction, NY 12533, pp. 242–yy248.

*Primary Examiner*—Carl W. Whitehead, Jr.
*Attorney, Agent, or Firm*—David V. Carlson; Theodore E. Galanthay; Lisa K. Jorgenson

[57] ABSTRACT

An electrical connection structure is provided for protecting a barrier metal layer within a contact opening during the formation of an aluminum interconnection layer overlying a tungsten plugged connection structure. The deposited tungsten plug overlying the barrier metal layer is etched back sufficiently to create a slight recess at the opening. A thin layer of tungsten is then selectively deposited for filling the recess. This layer acts as an etch stop during aluminum interconnection layer formation and protects the underlying barrier metal layer.

15 Claims, 4 Drawing Sheets

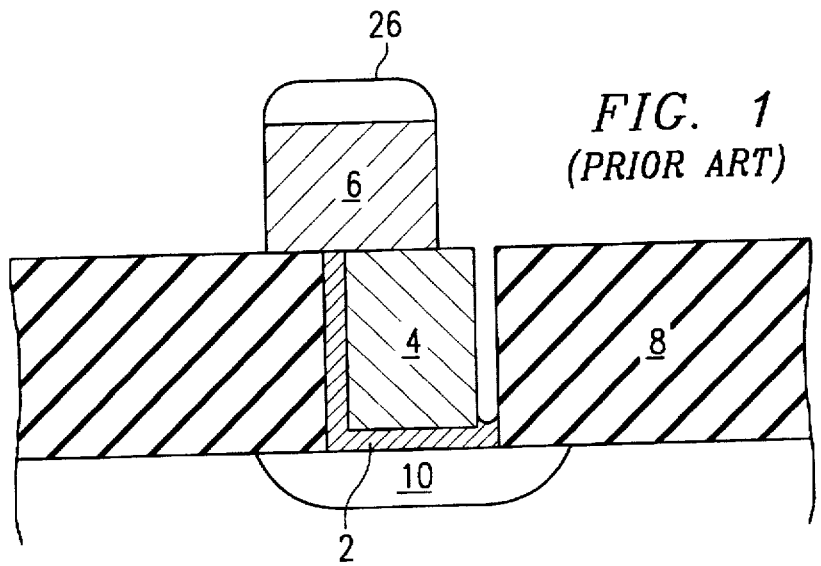
FIG. 1
(PRIOR ART)
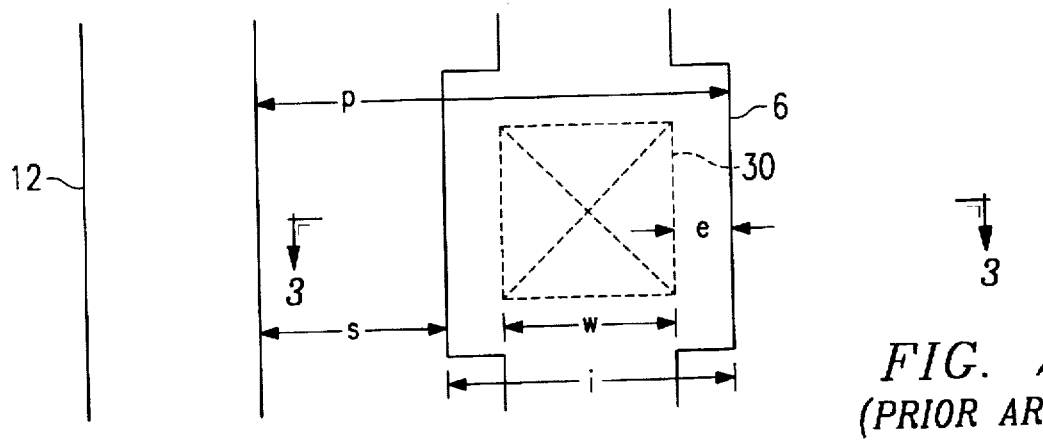
FIG. 2
(PRIOR ART)
FIG. 3
(PRIOR ART)
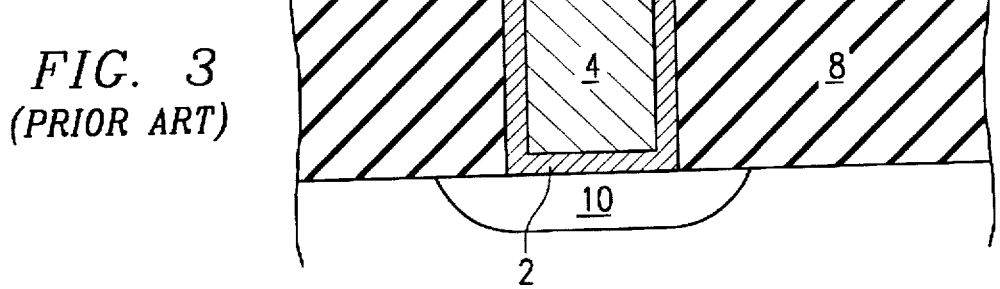

SEMICONDUCTOR CONTACT STRUCTURE IN INTEGRATED SEMICONDUCTOR DEVICES

CROSS-REFERENCE TO RELATED APPLICATION

This application is a continuation of U.S. patent application No. 08/366,215, filed Dec. 29, 1994, now abandoned.

TECHNICAL FIELD

The present invention relates generally to semiconductor devices, and more specifically to a structure and method for forming electrical connections between levels of a semiconductor device.

BACKGROUND OF THE INVENTION

It is a common practice in the fabrication of integrated circuits to make use of an interconnection layer of aluminum, which is highly conductive while being relatively easy to deposit and etch, for connecting different elements of the integrated circuit to each other. This layer usually rests on an insulating layer which in turn is located above a conductive layer. The insulating layer is opened prior to deposition of the aluminum in order to expose the conductive layer surfaces with which to establish a metallic interconnection. These conductive surfaces can be monocrystalline silicon surfaces (transistor sources, drains, collectors, bases and emitters), polycrystalline silicon elements (field-effect transistor gates) or metallic surfaces of another interconnection layer. The contact opening is initially filled or "plugged" with a metallic layer, such as aluminum or tungsten, to make a solid electrical connection between the underlying conductive layer and the overlying interconnection aluminum layer.

However, problems occur with aluminum contacts on silicon because of interdiffusion of aluminum in later process steps and degrading over time. Aluminum may also create spiking in the silicon. To prevent spiking and alloying between an aluminum interconnection metal and silicon surface, a thin "barrier" or "seed" metal layer is deposited on the exposed silicon surface of the contact opening prior to plugging the opening with aluminum. The most useful and practical barrier metal has been a titanium, or titanium nitride on titanium (TiN/Ti) bilayer which deposits well on silicon and silicon dioxide surfaces and also acts as glue for metal plugs of tungsten on silicon surfaces. The TiN/Ti scheme, however, has some drawbacks. It does not deposit easily and uniformly on the vertical sidewalls of an opening, and the thickness on the bottom is a small fraction of that on the surface outside the contacts when spattering or physical vapor deposition is used. The bottom and sidewall coverage is especially important in "hot aluminum plug" processing in order to facilitate the surface diffusion of aluminum atoms into the contact opening and to withstand an even greater tendency for spiking due to the high aluminum deposition temperature. In order to ensure adequate deposition of the barrier film on the bottom and sidewalls of a contact opening for such aluminum plugs, it was previously necessary to step down the contact opening as shown in the prior art for U.S. Pat. No. 4,592,802 and U.S. Pat. No. 5,231,051. However, such steps of the contact opening uses valuable layout space of a silicon structure.

This problem is partly solved by the use of chemical vapor deposition (CVD) tungsten etched back plug, a process well-known in the art and described in U.S. Pat. Nos. 4,592,802 and 5,231,051, both of which are incorporated herein by reference. In this process, the contact opening is filled with tungsten to a level above the insulating layer to make sure the opening is completely filled. The deposited tungsten is then etched back without a mask until the insulating layer is exposed. Because CVD of tungsten is generally conformal, i.e., the deposition rate on vertical surfaces is generally the same as that on horizontal surfaces, this method produces a complete plug in the opening. By using this method, a barrier metal layer is no longer needed to prevent the problem of spiking between an aluminum plug and silicon.

Despite the success achieved with tungsten plugs in preventing spiking, however, it is still desirable to have a barrier metal layer at the bottom of the contact opening. The barrier layer underlying the tungsten plug is desired not because of the spiking problem as in the case of aluminum, but because of a quite different phenomenon known as "tungsten encroachment" or "worm-holing." Tungsten and silicon do not readily react at typical metallization temperatures of less than 500° C. However, the CVD of tungsten is performed using $WF_6$ and the fluorine in $WF_6$ reacts with silicon in the presence of tungsten which acts as a catalyst in the reaction. This tungsten encroachment problem is well-known in the art and widely reported in industry literatures. A barrier metal layer such as TiN solves this problem by preventing fluorine from contacting silicon surfaces.

While the barrier metal is needed only at the bottom of the contact opening to prevent the tungsten encroachment problem, it is still necessary, or at least desirable, to deposit the barrier metal on the sidewalls of the contact opening as well. This is because CVD tungsten does not readily deposit on or adhere to an insulating layer such as $SiO_2$. Since the contact opening sidewalls are part of the insulating layer, a continuous barrier metal layer on the sidewalls is helpful to ensure conformal deposition of tungsten required to form a complete plug within the contact opening.

Hence, regardless of which metal (aluminum or tungsten) is used as a connection plug, the need for a continuous barrier metal layer on the sidewalls, especially in large aspect ratio contact openings, now about 3.5:1 to as much as 5:1 for advanced integrated circuits, is still present. Because of this, the industry has expended a great deal of effort in achieving conformal deposition of barrier metal in the contact opening. To this end, integrated circuit processing industry has recently developed a CVD of TiN process which provides good sidewall coverage of the contact opening and most manufacturers are moving toward CVD of TiN.

However, a good consistent barrier film in the contact opening which affords good adhesion to all surfaces and prevents encroachment at the bottom of contact openings presents a new difficulty. It is possible, in some instances, due to mask misalignment and other process variations, that a metallic interconnection layer over a metal tungsten plug in the contact opening fails to completely cover every portion of that opening. In those cases, during etching of the metallic interconnection layer, the barrier metal exposed to the etching chemical will also be etched, which results in void formation or even spiking along the sidewalls of the contact opening.

Selective etching of tungsten relative to aluminum or titanium is easy to achieve. Tungsten, for example, is selectively etched with fluorine ions over titanium, titanium nitride, and aluminum. In addition, titanium, titanium nitride, and aluminum are selectively etched with chlorine ions relative to tungsten. Because of this etching selectivity, the tungsten plug within the contact opening can be etched back very uniformly and completely using titanium nitride, a barrier metal, as an etch stop. Then during the formation of an aluminum interconnection layer, for example, the tungsten plug is used as an etch stop for the aluminum. This aluminum etch process is relatively long due to the need to remove residual aluminum and titanium nitride over topographical steps, where they are more difficult to etch.

The problem recognized by applicants is that the chlorine etch preferred for etching aluminum also etches barrier metals such as titanium or titanium nitride. As a result, the barrier metal between the sidewall and the tungsten plug will also be etched when aluminum is etched. Because the etching period and over etch period for the aluminum metal is relatively long, the barrier metal on the sidewall can erode partially even towards the bottom of the contact opening. This may destroy the underlying conductive region such as a transistor source or drain located underneath the tungsten plug.

One method of preventing this problem is to make the interconnection layer of aluminum sufficiently large over the plug so that it completely covers and encloses the tungsten plug. A minimum enclosure defines the extra surface area which must be added to an interconnection layer in order to compensate for mask misalignment and other process variations. The widened portion over the plug may be typically approximately twice the interconnection layer width for small geometry devices. This enlarged area is designed to be centered on the interconnection layer, but it may be offset to one side and made sufficiently large to compensate for mask misalignment and other process variations. For example, if an interconnection layer has a width of 1 micron, the width of the region overlying the contact opening might be 2.0 microns to ensure complete coverage and enclosure of the tungsten plug and titanium sidewall. It is clearly disadvantageous to have wider interconnection layers or enlarged regions over a contact, especially in today's integrated circuit devices in which the circuit elements and interconnection layers are packed more tightly than ever before; in today's 0.35 micron technology devices, for example, the interconnection layers may be only 0.4–0.5 micron wide and stacked three to five levels deep.

Thus, it would be desirable to provide a contact opening that is not subject to erosion during formation of an interconnection layer. It would also be desirable to do this in such a way as to preserve much of the barrier metal deposited on the sidewalls so that deposition of a metal plug within the opening is conformal.

SUMMARY OF THE INVENTION

According to principles of the present invention, an electrical connection structure and method are provided for protecting a barrier metal layer within the contact opening during the formation of an interconnection layer overlying the contact opening.

Conductive layer regions of integrated circuit elements are formed above a semiconductor substrate. An insulating layer is deposited over those conductive layers. A contact opening is etched through the insulating layer exposing a portion of the underlying conductive layer. To form a connection plug, a thin layer of a barrier metal is deposited on the insulating layer which results in deposition of the barrier metal on the exposed area of the underlying conductive layer and the sidewalls of the contact opening. Over the thin barrier metal layer in the opening, a conductive material such as tungsten is deposited to a sufficient thickness to fill the opening. Then the deposited conductive material is etched back without a mask until the barrier metal on the insulating layer is exposed. For a controlled period of time thereafter, the deposited conductive material is etched back further in order to create a slight recess below the contact opening. This will expose an upper portion of the thin barrier metal layer on the sidewalls of the opening. The next step is to etch the thin layer of the barrier metal on the insulating layer and the exposed barrier metal within the opening. This step may create a slight erosion of the barrier metal layer between the conductive material and sidewalls near the top of the conductive material. Within the recess and on the exposed barrier metal layer, conductive material is selectively deposited. The selective deposition of the conductive material covers the contact opening and protects the thin layer of the barrier metal on the sidewalls and the bottom surface of the contact opening from subsequent etch steps. For example, during the formation of an aluminum interconnection layer over a selectively deposited tungsten, aluminum is selectively etched over tungsten, the tungsten acting as an etch stop. Since the barrier metal layer is covered by the selectively deposited tungsten, the aluminum etchant does not come in contact with the barrier metal layer and it is not etched.

BRIEF DESCRIPTION OF THE DRAWINGS

FIG. 1 shows a cross-sectional view of a contact opening that is not covered by an interconnection layer and illustrates the risk of erosion of the barrier metal.

FIG. 2 is a plan view of a prior art interconnection layer formed over a contact opening.

FIG. 3 is a cross-sectional view of the prior art device taken along lines 3—3 of FIG. 2.

DETAILED DESCRIPTION OF THE INVENTION

Figure 4A:
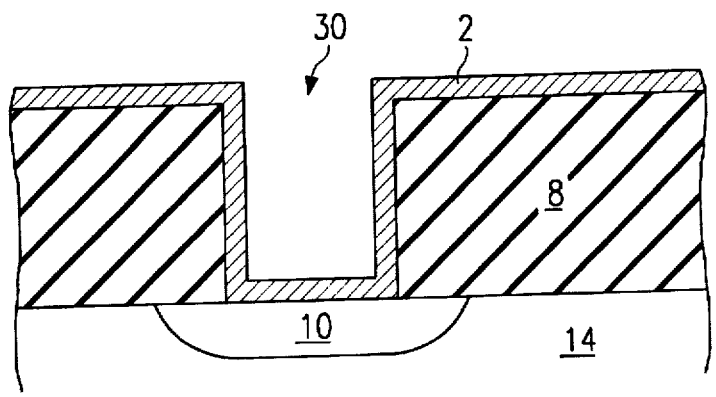
FIGS. 4A–4I show the successive steps of forming a connection structure according to principles of the present invention.

FIG. 1 illustrates the problem recognized by applicants. A photoresist 26 used to pattern an interconnection layer 6 may be misaligned with an underlying connection area. During etching of the interconnection layer 6 such as aluminum, a deposited metal plug 4 such as tungsten is used as an etch stop. Because the photoresist 26 is misaligned with the metal plug 4, the exposed barrier metal 2 is etched along with aluminum 6. The barrier metal layer 2 erodes along the sidewall of the contact opening as shown. This will result in poor electrical contact between the interconnection layer 6 and an underlying conductive layer region 10. It is common in the art to overetch during an aluminum etching process due to the need to remove residual aluminum and barrier metal. Consequently, in the worst case, the erosion of the barrier metal 2 may continue all the way down the sidewall and onto a portion of the conductive layer 10 destroying the associated electrical circuit. As there are more than a million electrical circuits in today's integrated circuit chips, those skilled in the art will appreciate that even one defective circuit can render the entire integrated circuit chip unusable. Even if the etch does not remove the titanium to the layer 10, it may still be etched from the sidewall sufficient to cause the plug 4 to move in the hole and create electrical problems.

FIG. 2 shows a plan view of a prior art interconnection layer 6 formed over a contact opening 30 for preventing the side erosion problem by using the enclosure rule discussed above. A widened portion of the interconnection layer 6 is centered over the contact opening 30. A second interconnection layer 12 runs alongside the first layer 6. While the width of the interconnection layer is only w, extra width of e must be added to each side to the layer 6 to compensate for a maximum misalignment of e to either side of the contact opening 30. This will increase the pitch p (width of interconnection layer i+spacing s) between interconnection layers 6, 12 at the level of contact openings resulting in waste of valuable layout space.

FIG. 3 is a cross-sectional view of the prior art interconnection layer 6 taken along lines 3—3 of FIG. 2. As can be seen, the enclosure requirements reduce the density of interconnection layers 6, 12 that can be formed over the insulating layer 8 since each layer has a portion with a widened area.

Figure 4B:
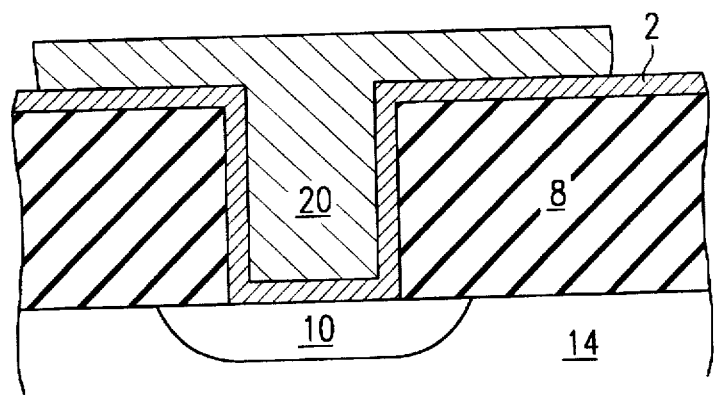
Figure 4C:
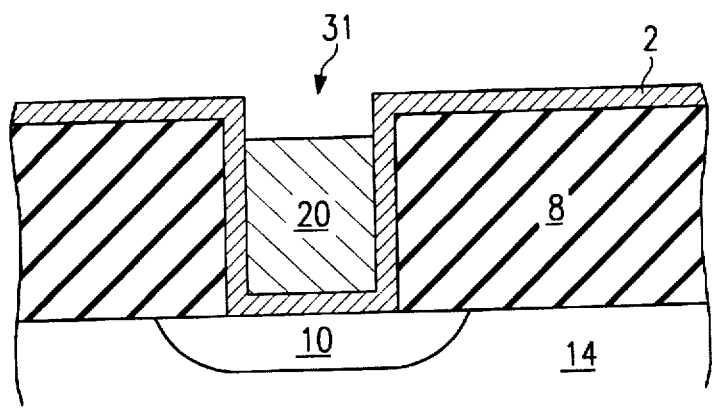

FIGS. 4A through 4I show a presently preferred method of protecting a liner material layer 2 during formation of an interconnection layer 6 overlying a contact opening 30. A semiconductor substrate 14 contains a conductive layer region 10 to which electrical contact is desired (FIG. 4A). Alternatively, the layer 14 is an interconnection layer of itself, either of polysilicon or metal. An insulating layer of silicon dioxide 8 overlies the substrate 14. A contact opening 30 is made through the insulating layer 8. Over that insulating layer 8 and in the opening 30, a thin layer 2 of a barrier metal is deposited. The liner material 2 which is deposited inside the contact opening 30 is preferably a barrier metal, such as titanium, titanium nitride, or titanium nitride on titanium bilayer. Alternatively, other alloys or compounds that provide the desired function of improved adhesion and protection of the lower layers may be used for the liner layer 2. In another alternative, a sandwich structure of barrier metal/barrier metal compound/barrier metal may also be used, such as Ti/TiN/Ti. However, any material, whether metal or semi-metal which can be selectively etched over the connection plug material 22 can be used. The deposition can be done either by sputtering the barrier metal 2 or alternatively by a relatively new process of barrier metal CVD although the CVD method limits the choice of a barrier metal to titanium nitride. This barrier metal layer 2 can have a thickness in the range of from approximately 100 Å to more than 3,000 Å, depending on the design requirements. Over the barrier metal 2, a conductive material 20 is conformally deposited preferably by using a CVD (FIG. 4B). In one embodiment, the conductive material 20 is tungsten. In another embodiment, the conductive material 20 is aluminum or other highly conductive material that is conformally deposited. The deposited conductive material 20 is then etched back without a mask. The etch continues until the barrier metal layer 2 on the insulating layer 8 is exposed. Then for a controlled amount of time, the material 20 inside the contact opening 30 is etched further to create the desired level of recess 31 below the opening 30 (FIG. 4C). The depth of the recess is preferably in the range of 50 Å to 1000 Å for reasons discussed later herein.

Figure 4D:
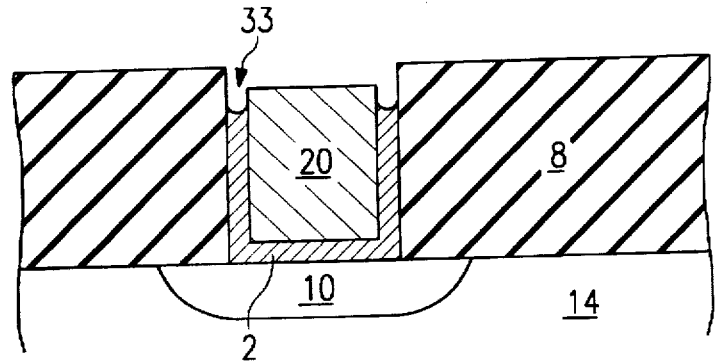

Once the desired recess level is created, the etch is terminated and the barrier metal layer 2 is etched. Many acceptable etching techniques for the barrier metal are known; one acceptable technique is a plasma etch using chlorine ions until the insulating layer 8 is exposed (FIG. 4D). An etch that is selective to the barrier metal over the tungsten plug is preferred. In this etching process, a slight recess 33 of the barrier metal layer 2 on the sidewalls of the opening 30 may be created, but is not necessary, as shown in FIG. 4D.

Figure 4E:
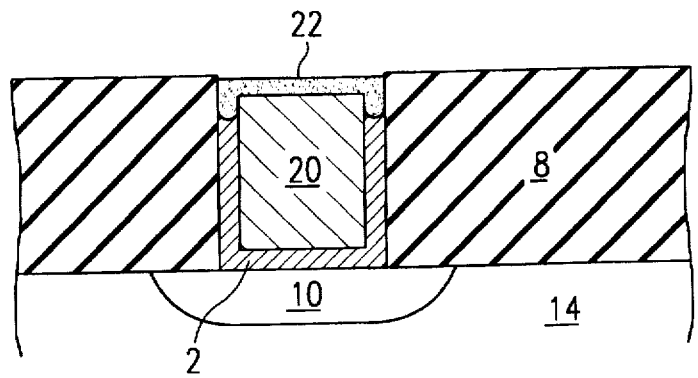

A selective tungsten deposition is then performed for filling the recesses 31 (and 33 if present) within the contact opening 30 (FIG. 4E). This selective tungsten deposition is performed without a mask. The deposition chemistry is selected such that tungsten will selectively deposit on the plug 20 but not on the insulator 8. Deposition chemistry to perform selective tungsten deposition on tungsten or other materials, such as aluminum, is known in the art, having been described in published literature. One preferred process is a chemical vapor deposition process in which, $WF_6$ and $H_2$ are introduced with a relatively high $H_2$ to $WF_6$ flow ratio to deposit tungsten onto tungsten. Preferably the flow ratio is in the range of 10 to 20 more $H_2$ than $WF_6$. Under this environment, up to a 1000 Å of tungsten 22 will be selectively deposited on the exposed tungsten surface 20 before being deposited on other surfaces. This etch stop layer 22 of tungsten 22 protects the underlying barrier metal layer 2 on the sidewalls and the conductive layer region 10, and also acts as an complete etch stop for chlorine ions which will later be used to etch an aluminum interconnection layer 6. The depth of the recess 31 is selected to be sufficiently deep that a protective tungsten layer is formed, but not so deep that selective deposition onto only tungsten is not easily achieved. Thus, the range of 50 Å to 1000 Å is preferred based on today's technologies. A mask and etch step is not required, thus simplifying the process.

Figure 4F:
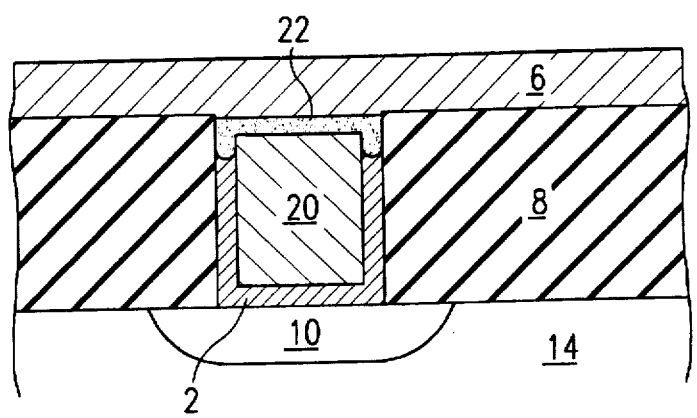
Figure 4G:
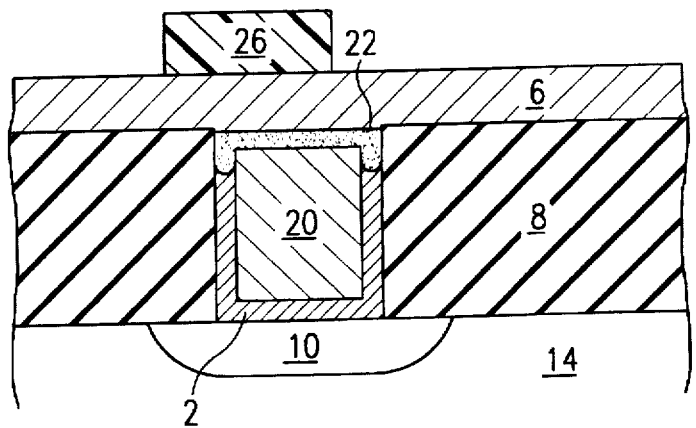
Figure 4H:
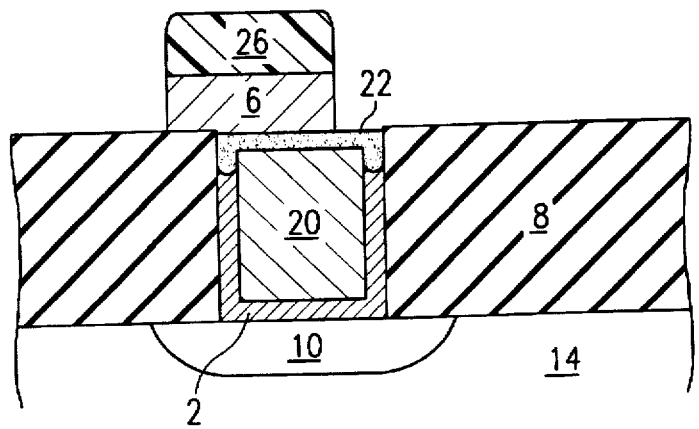
Figure 4I:
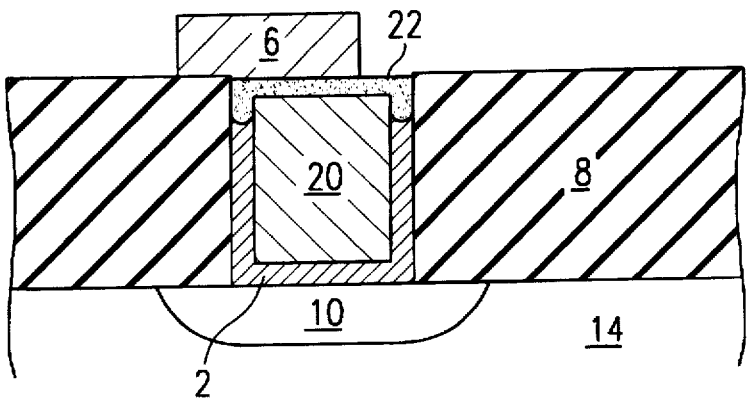

Referring to FIG. 4F, during the formation of an aluminum interconnection layer 6 over a selectively deposited tungsten 22, aluminum 6 is blanket deposited over the insulating layer 8. A photoresist pattern 26 is then placed over selected regions of aluminum (FIG. 4G). The regions of the deposited aluminum which are not covered by the photoresist 26 are selectively etched over tungsten 22 which acts as an etch stop (FIG. 4H). The photoresist feature 26 may be misaligned, as shown. Since the barrier metal layer 2 is covered by the selectively deposited tungsten 22, the aluminum etchant does not come in contact with the barrier metal layer 2.

If the interconnection layer 6 is aluminum, the etch stop layer 22 is not aluminum. The material of layer 22 is selected to be an etch stop for the etching of interconnection layer 6. Thus, in one embodiment, the plug 20 is formed of tungsten, the cap layer 22 is tungsten, and the interconnection layer 6 is aluminum. In an alternative embodiment, the plug 20 is aluminum, the stop layer 22 is tungsten, and the interconnection layer 6 is aluminum.

In another alternative, where the conductive layer 10 is compatible with the plug material 20, no liner layer 2 is used. For example, the conductive layer 10 may be aluminum and the plug 20 is aluminum so that no liner layer 2 is needed. In this embodiment, the interconnection layer 6 is also aluminum. Thus, the etch stop layer 22 is formed as previously described using an etch stop material for an aluminum etch such as tungsten, as the layer 22.

Figure 5:
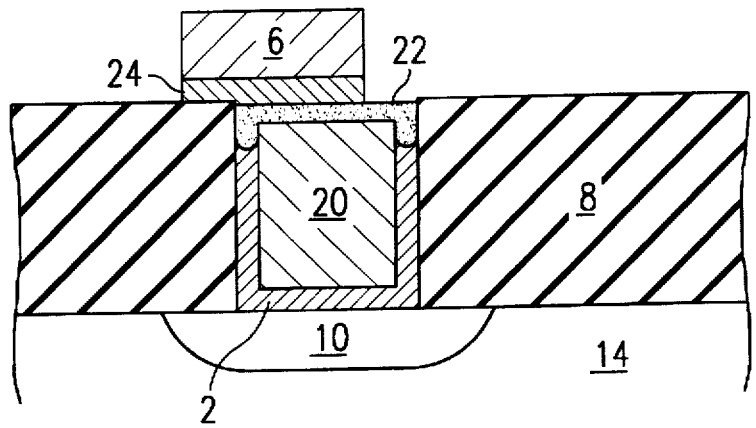
FIG. 5 is a cross sectional view of a connection structure with an optional cap layer.

Referring now to FIG. 5, a conductive cap layer 24 is optionally placed between the interconnection layer 6 and the connection structure 2, 20, 22 in one embodiment. The cap layer 24 is blanket deposited before the blanket deposition of the layer 6 as shown in FIG. 4G. The aluminum is then blanket deposited over the cap layer 24 and a single mask is used to etch both layers. The cap layer 24 is used for improving the interface chemistry at the contact level. This includes lower electrical resistance at the interface, and better adhesion between the interconnection layer 6 and the connection structure 2, 20, 22. Since the desired properties of a cap layer 24 are similar to those of barrier metal, any barrier metal discussed above would also be suitable as the cap layer 24.

Figure 6:
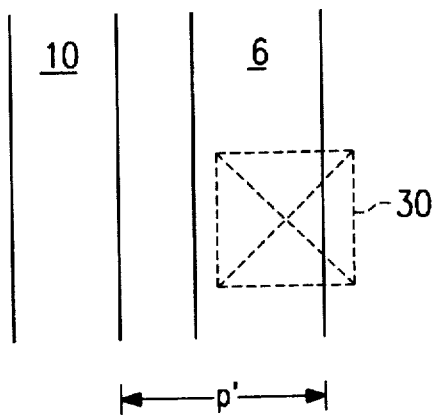
FIG. 6 is a plan view of an interconnection layer formed over a connection structure.

Referring to FIG. 6, one misaligned interconnection layer 6 is overlying a contact opening 30. While this would have been a major concern in the past, the connection structure 2, 20, 22 according to the present invention allows for this type of misalignment since the barrier metal 2 along the sidewalls of the opening 30 is fully protected from the etching chemical used to pattern the interconnection layer 6. Since there is no widened portion of the interconnection layer 6 over the connection structure 2, 20, 22, a second interconnection layer 10 can be placed much closer to the first layer 6 as compared to those in FIG. 2. As can be seen, the pitch p' in FIG. 6 is much shorter than the pitch p in FIG. 2, which allows the electrical circuits and interconnection layers 6, 10 to be more tightly packed than was previously possible.

The process steps and structures described are not the complete process flow of every step for fabricating an entire integrated circuit. Such steps are well known in the art and need not be described. The present invention can be practiced in conjunction with integrated circuit fabrication techniques currently used in the art, and only so much of the commonly practiced process steps are included as are necessary for an understanding of the present invention. The figures included herein are not drawn to scale, but instead are drawn to illustrate the important features of the invention.

The method of forming a connection plug structure described herein is illustrated as making a contact to a conductive region of an underlying silicon substrate. As will be appreciated by those skilled in the art, the same techniques can be used to fabricate a connection structure between an upper interconnection layer and an underlying polycrystalline silicon interconnect, or between two metal interconnection layers.

An electrical connection structure and method for protecting a barrier metal layer within a contact opening during the formation of an interconnection layer overlying the connection structure have been disclosed herein. While various embodiments have been described in this application for illustrative purposes, the claims are not limited to the embodiments described herein. For example, although only a limited number of barrier metal types are disclosed, any other conductive metal such as tantalum or molybdenum may also be used. The selectively deposited layer 22 is preferably tungsten or a tungsten alloy, but any other acceptable conductive material which can be a selective etch stop relative to the interconnection layer 6 may be used. Other equivalent devices or steps may also be substituted for those described, which operate according to the principles of the present invention, and thus fall within the scope of the claims.

We claim:

1. An electrical connection structure for an integrated circuit device, comprising:

a conductive layer;

an insulating layer overlying the conductive layer, the insulating layer having an upper surface;

an opening through the insulating layer and exposing a region of the conductive layer, the opening having sidewalls;

a thin layer of a barrier material covering the exposed conductive layer region and only a portion of the sidewalls such that the upper portion of the sidewalls is not covered by the barrier material;

a conductive material filling the opening over the thin layer of the barrier material to a level below the insulating layer upper surface leaving a portion of the barrier material exposed;

an etch stop layer positioned over the first conductive material and the exposed barrier material, and having an upper surface approximately co-planar with the insulating layer upper surface; and an interconnection layer overlying the etch stop layer and being of a material that is selectively chemically-etchable with respect to the etch stop layer.

2. The structure according to claim 1, further comprising a thin conductive cap layer placed between the etch stop layer and the interconnection layer for better interface chemistry therebetween.

3. The structure according to claim 1 wherein the thin layer of the barrier material is titanium, or titanium nitride, or titanium nitride on titanium bilayer.

4. The structure according to claim 1 wherein the first conductive layer is a polysilicon or doped silicon.

5. The structure according to claim 1 wherein the conductive layer is an interconnection layer to other integrated circuit elements.

6. The structure according to claim 1 wherein the lateral dimension of the opening is approximately one micron for insulating layer having a thickness in the range of one to four microns.

7. The structure according to claim 1 wherein the thickness of the etch stop layer ranges from one hundred angstrom to one thousand angstrom.

8. An electrical connection structure for an integrated circuit device, comprising:

a conductive layer;

an insulating layer overlying the conductive layer, the insulating layer having an upper surface;

an opening through the insulating layer and exposing a region of the conductive layer, the opening having sidewalls;

a thin layer of a barrier material covering the exposed conductive layer region and only a portion of the sidewalls such that the upper portion of the sidewalls is not covered by the barrier material;

a conductive material filling the opening over the thin layer of the barrier material to a level below the insulating layer upper surface;

an etch stop layer positioned over the conductive material and the exposed barrier material, and having an upper surface approximately co-planar with the insulating layer upper surface; and an interconnection layer overlying the etch stop layer and being selectively etchable with respect to the etch stop layer, wherein the etch stop layer is tungsten.

9. The structure according to claim 8 wherein the etch stop layer is formed by chemical vapor deposition with a relatively high $H_2$ to $WF_6$ flow ratio.

10. The structure according to claim 9 wherein the $H_2$ to $WF_6$ flow ratio ranges from 5 to 20.

11. The structure according to claim 1 wherein the conductive material and etch stop layer are both tungsten.

12. The structure according to claim 1 wherein the etch stop layer is aluminum.

13. The structure according to claim 1 wherein the lower portion of the etch stop layer around the sidewalls of the opening extends down to a level below the upper surface of the conductive material.

14. An electrical connection structure for an integrated circuit device, comprising:

a conductive layer;

an insulating layer overlying the conductive layer, the insulating layer having an upper surface;

an opening through the insulating layer and exposing a region of the conductive layer, the opening having sidewalls;

a conductive material filling the opening to a level below the insulating layer upper surface;

an etch stop layer positioned over the conductive material, the etch stop layer having an upper surface approximately co-planar with the insulating layer upper surface; and an interconnection layer overlying the etch stop layer, the interconnection layer being of a material that is selectively chemically-etchable with respect to the etch stop layer such that the etch stop layer is an etch stop for the etching of the interconnection layer.

15. An electrical connection structure for an integrated circuit device, comprising:

a first conductive layer;

an insulating layer overlying the first conductive layer, the insulating layer having an upper surface;

an opening through the insulating layer and exposing a region of the first conductive layer, the opening having sidewalls;

a conductive material filling the opening to a level below the insulating layer upper surface;

an etch stop layer positioned over the first conductive material, the etch stop layer having an upper surface approximately co-planar with the insulating layer upper surface; and an interconnection layer overlying the etch stop layer, the interconnection layer being selectively etchable with respect to the etch stop layer such that the etch stop layer is an etch stop for the etching of the interconnection layer, wherein the first conductive layer, the conductive material and the interconnection layer are all aluminum and the etch stop layer is tungsten.

* * * * *